United States Patent
Chung et al.

(10) Patent No.: US 6,315,834 B1
(45) Date of Patent: Nov. 13, 2001

(54) METHOD FOR REMOVING EXTRANEOUS MATTER BY USING FLUORINE-CONTAINING SOLUTION

(75) Inventors: Ping-Chung Chung, Hsinchu; Tsung-Lin Lu, Tainan; Hunter Chung, Hsinchu; Chin-Hsien Chen, Taitung; Weng-Yi Chen, Jubei; Jack Yao, Pingtung; Chienfeng Chen, Kaohsiung, all of (TW)

(73) Assignees: Utek Semiconductor Corp.; United Microelectronics Corp., both of Hsinchu (TW)

( * ) Notice: Subject to any disclaimer, the term of this patent is extended or adjusted under 35 U.S.C. 154(b) by 0 days.

(21) Appl. No.: 09/427,201

(22) Filed: Oct. 25, 1999

(51) Int. Cl.$^7$ .................................................... C03C 23/00
(52) U.S. Cl. ................................. 134/2; 134/3; 134/22.1; 134/41; 438/745
(58) Field of Search .................................. 438/745, 747, 438/748, 749, 754, 756; 134/2, 3, 22.1, 41

(56) References Cited

U.S. PATENT DOCUMENTS

| | | | |
|---|---|---|---|
| 5,587,103 | * 12/1996 | Dennis | 252/79.3 |
| 5,681,448 | * 10/1997 | Uchiyama et al. | 205/656 |
| 5,972,123 | * 10/1999 | Verhaverbeke | 134/3 |
| 5,998,260 | * 12/1999 | Lin | 438/254 |

* cited by examiner

*Primary Examiner*—Robert Kunemund
*Assistant Examiner*—Binh X. Tran

(57) ABSTRACT

A method for removing extraneous matters from a stainless device is provided. The method includes the steps of (a) providing a container for holding a fluorine-containing neutral solution therein, (b) immersing said stainless device in said fluorine-containing neutral solution to remove said extraneous matters from said stainless device, and (c) heating and swirling said fluorine-containing solution. The fluorine-containing neutral solution is made from neutralizing hydrofluoric acid (HF) with ammonium hydroxide ($NH_4OH$), neutralizing hydrofluoric acid (HF) with ammonium fluoride ($NH_4F$), or dissolving ammonium acid fluoride ($NH_4F$) in a deionized water (DIW).

15 Claims, 1 Drawing Sheet

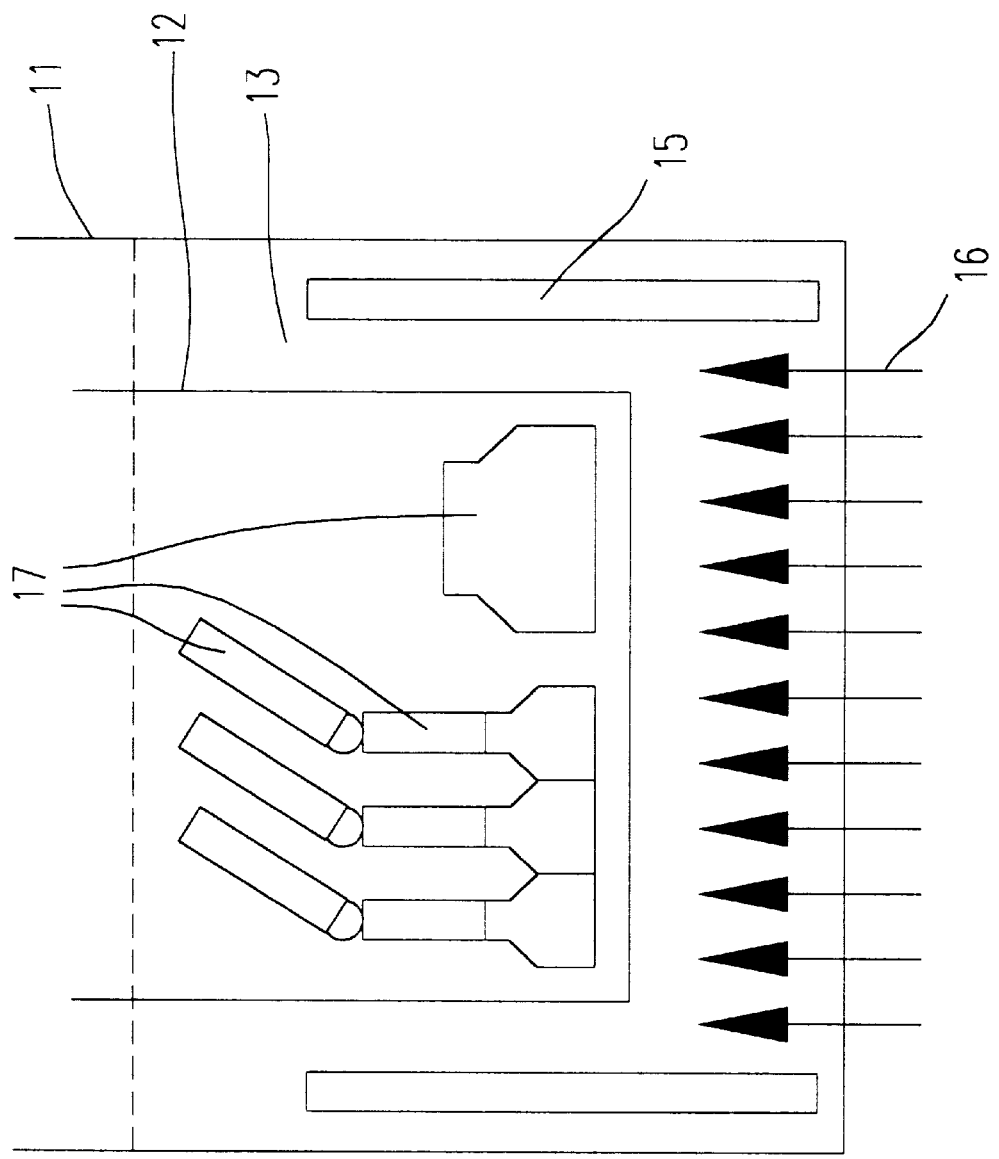

"METHOD FOR REMOVING EXTRANEOUS MATTER BY USING FLUORINE-CONTAINING SOLUTION

FIELD OF THE INVENTION

The present invention relates to a method for removing extraneous matter by using fluorine-containing neutral solution, and especially to a method for removing extraneous matter from a stainless device applied in a semiconductor-manufacturing process by using fluorine-containing solution.

BACKGROUND OF THE INVENTION

Borophosphosilicate glass (BPSG) has been extensively used as the doped silicon oxide layer material for semiconductor wafers, and the BPSG layer is usually formed by atmospheric pressure chemical vapor deposition (APCVD). The BPSG layers are formed for filling gaps between adjacent metal lines in integrated circuits and for interlayer dielectric isolation.

While the APCVD process is performed, not only the semiconductor wafers but the equipment, such as the pipes and tanks, will also be covered by particles and powders. These particles will cluster together and adhere on the surface of the pipe or tank as an extraneous layer. If the pipe is choked up with the extraneous layer and some particles fall down on the semiconductor wafers, the deposition uniformity and thickness of the BPSG layer will be seriously affected. Therefore, the pipes, tanks, covers, and vessels of the APCVD system need to be cleaned (this cleaning procedure is called "preventive maintenance") after a predetermined number of wafers are deposited.

However, cleaning the APCVD system is not an easy task. The pipes and tanks of the APCVD system are usually made of stainless steel. General cleaning solutions can not totally remove all extraneous matters from the stainless devices, and the strong acid solutions, such as hydrofluoric acid (HF), will gradually corrode the stainless devices. Therefore, most manufacturers of the APCVD system advise users to scrub the stainless devices with brushes. Since the shapes of the pipe and tank are usually very complicated, it is hard to scrub out the extraneous matters completely with brushes. Some extraneous matters may still stay on the APCVD system. In order to ensure that all extraneous matters are totally removed, users must waste a lot of time for cleaning the APCVD system and testing whether the APCVD system is completely cleaned or not so that the working hours of the APCVD system is shortened and the cost is increased.

In addition, while the APCVD system is cleaning, particles and toxic gas will be spread into the air. When a maintenance man is brushing the APCVD system, he possibly inhales the harmful air.

It is therefore attempted by the applicant to deal with the above situation encountered with the prior art.

SUMMARY OF THE INVENTION

It is an object of the present invention to provide a novel method for removing extraneous matters from a stainless device applied in a semiconductor-manufacturing process.

It is another object of the present invention to provide a novel method for removing extraneous matters from a stainless device without requiring expensive equipment or complicated test procedures such that the cleaning process can be carried out using significantly less time to further reduce the production cost.

The method of the present invention includes the steps of (a) providing a container for holding a fluorine-containing neutral solution therein, and (b) immersing the stainless device in the fluorine-containing neutral solution to remove the extraneous matters from the stainless device.

According to the present invention, the stainless device can be a stainless pipe, a stainless tank, a stainless cover, or a stainless vessel of a APCVD system used in the semiconductor-manufacturing process, preferably a borophosphosilicate glass (BPSG) depositing process.

The extraneous matters are formed during the semiconductor-manufacturing process and remained on a surface of the stainless device as a silicon oxide layer.

The container for holding the fluorine-containing neutral solution is made of a material sufficient for resisting the corrosion of the fluorine-containing neutral solution. The fluorine-containing neutral solution is made from neutralizing hydrofluoric acid (HF) with ammonium hydroxide ($NH_4OH$), neutralizing hydrofluoric acid (HF) with ammonium fluoride ($NH_4F$), or dissolving ammonium acid fluoride ($NH_4F$) in a deionized water (DIW). The pH value of the fluorine-containing neutral solution is preferably ranged from about 6 to about 8.

According to the present invention, after the step (b), the method further includes a step of (c) heating the fluorine-containing solution to facilitate an effect of removing the extraneous matters from the stainless device.

In accordance with the present invention, the fluorine-containing neutral solution can be heated by a heater or by the reaction heat released from a neutralizing reaction for forming the fluorine-containing neutral solution.

Preferably, the fluorine-containing neutral solution is heated up to about 40° C.

According to the present invention, the method further includes a step of swirling the fluorine-containing neutral solution by using a pump or generating bubbles from a bottom of the container so that the fluorine-containing neutral solution can be enhanced to flow around the stainless steel to facilitate the effect of removing the extraneous matters from the stainless device.

Preferably, the bubbles are nitrogen ($N_2$) bubbles or clean-dry-air (CDA) bubbles, and the stainless device is immersed in the fluorine-containing neutral solution by a basket, wherein the basket is made of a material sufficient for resisting the corrosion of the fluorine-containing neutral solution.

The present invention may best be understood through the following description with reference to the accompanying drawings, in which:

BRIEF DESCRIPTION OF THE DRAWINGS

FIG. 1 schematically shows the stainless devices of a semiconductor-manufacturing system cleaned by the method of the present invention.

DETAILED DESCRIPTION OF THE PREFERRED EMBODIMENTS

The method of the present invention is used for removing extraneous matters from stainless devices of a semiconductor-manufacturing system by a fluorine-containing neutral solution. The semiconductor-manufacturing system is preferably a chemical vapor deposition system, such as atmospheric pressure chemical vapor deposition (APCVD) system, low pressure chemical vapor deposition (LPCVD) system, and plasma enhanced chemical vapor deposition (PECVD) system. The stainless devices can be any element, e.g. pipes, tanks, covers, and vessels, used in the semiconductor-manufacturing system. As shown in FIG. 1, the stainless devices 17 are dismantled from the semiconductor-manufacturing system and immersed in a container 11 full of fluorine-containing neutral solution 13. The container 11 is preferably made of a material sufficient to resist the corrosion of the fluorine-containing neutral solution 13, and the stainless devices 17 are immersed in the container 11 by a basket 12. The basket 12 is preferably a plastic basket.

The fluorine-containing neutral solution 13 of the present invention is made from neutralizing hydrofluoric acid (HF) with ammonium hydroxide ($NH_4OH$), neutralizing buffer oxide etcher (BOE) with ammonium hydroxide ($NH_4OH$) (the BOE is a mixture of hydrofluoric acid (HF) and ammonium fluoride ($NH_4F$)), or dissolving ammonium acid fluoride ($NH_4F$) in a deionized water (DIW). The pH value of the fluorine-containing neutral solution 13 is ranged from about 6 to about 8.

To facilitate the cleaning effect, the temperature of the fluorine-containing neutral solution 13 is preferably heated up to about 40° C. by a heater 15 or by the reaction heat released from the neutralizing reaction for forming the fluorine-containing neutral solution 13. In addition, the fluorine-containing solution 13 is preferably swirled by using a pump or by generating bubbles 16 from a bottom of the container 11 so that the fluorine-containing neutral solution 13 can be enhanced to flow around the stainless devices.

For example, if the extraneous matters are silicon oxides formed during a borophosilicate glass (BPSG) deposition process by using an APCVD system and the stainless devices are elements of the APCVD system, experimental data are listed in Table 1 and Table 2 to prove the excellent etching behavior of the method of the present invention. The comparison of the time for removing silicon oxides from the stainless devices by the conventional BOE solution and that by the fluorine-containing neutral solution of the present invention is shown in Table 1.

Table 1: Time for removing silicon oxides from stainless devices by the conventional BOE solution and by the fluorine-containing neutral solution. The BOE solution is formed by mixing hydrofluoric acid (HF) with ammonium fluoride ($NH_4F$) in a ratio of 7:1. The fluorine-containing neutral solution is made from neutralizing HF with $NH_4OH$.

| Solution | Temperature | Time (min) |
| --- | --- | --- |
| BOE 100% | R.T. | 20 |
| BOE 50% + DIW 50% | R.T. | 50 |
| BOE 33.3% + DIW 66.7% | R.T. | 70 |
| Fluorine-containing neutral solution | R.T. | >270 |
| Fluorine-containing neutral solution | 40° C. | 21 |

As shown in Table 1, the time for removing silicon oxides by 100%, 50%, and 33.3% BOE at room temperature are respectively 20, 50, and 70 minutes. On the other hand, the time for removing silicon oxides by the fluorine-containing neutral solution of the present invention at room temperature is over 4.5 hours. However, if the fluorine-containing neutral solution is heated up to about 40° C., the time for removing silicon oxides is reduced to 21 minutes. It is easy to identify that the cleaning efficiency of the fluorine-containing neutral solution is not good at room temperature, but the cleaning efficiency can be enhanced by increasing the operating temperature.

The fluorine-containing neutral solution of the present invention is particularly suitable for removing silicon oxides from stainless devices. Nevertheless, the fluorine-containing neutral solution can still be used for removing silicon oxide from other kinds of materials, but the fluorine-containing neutral solution will cause these materials to be corroded a little. The weight losses of many different kinds of materials are shown in Table 2.

Table 2: Weight loss of many different kinds of materials. The immersing time is 20 hours, the fluorine-containing neutral solution is heated to 40° C.

| | Weight (From) | Weight (To) | Weight Loss | Weight Loss % |
| --- | --- | --- | --- | --- |
| Stainless Steel (S304) | 38.3269 g | 38.3269 g | 0 g | 0 |
| Aluminum | 58.250 g | 58.0188 g | 0.3062 g | 0.524 |
| Copper | 68.6375 g | 68.3609 g | 0.2766 g | 0.4 |
| Plastic | 38.9051 g | 38.8981 g | 0.007 g | 0.0179 |

As shown in Table 2, after 20 hours of immersion in 40° C. fluorine-containing neutral solution, the weight losses of aluminum, copper, and plastic are respectively 0.524%, 0.4%, and 0.0179% but stainless steel 304 does not have any weight loss.

However, if the fluorine-containing neutral solution is heated up to 80° C., stainless steel can still be corroded by the fluorine-containing neutral solution a little. Table 3 lists the conditions of stainless steel corroded by different cleaning solutions.

Table 3: Conditions of stainless steel corroded by different cleaning solutions.

| | Temperature | Time | Weight Loss | Appearance |
| --- | --- | --- | --- | --- |
| BOE 50% + DIW 50% | R.T. | 43.5 hr | No Data | Black |
| Fluorine-containing neutral solution | 40° C. | 13 hr | 0% | Metal Luster |
| Fluorine-containing neutral solution | 80° C. | 6 hr | 0.014% | Black |

As shown in Table 3, the R.T. conventional BOE solution will damage stainless steel after 43.5 hours and the appearance of stainless steel is turned to be black. On the other hand, the 40° C. fluorine-containing neutral solution stainless steel will not damage stainless steel, but if the fluorine-containing neutral solution is at 80° C., stainless steel could be corroded a little after 6 hours.

To sum up, the method of the present invention can remove the extraneous materials from the stainless devices of a semiconductor-manufacturing system effectively and cleanly without brushing the stainless devices by hand. In addition, the method of the present invention can remove silicon oxide from stainless devices without requiring expensive equipment or complicated test procedures such that the production cost is saved.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for removing extraneous matters from a stainless device applied in a chemical vapor deposition process, comprising the steps of:
   (a) providing a container for holding a fluorine-containing solution formed by mixing hydrofluoric acid (HF) and ammonium hydroxide ($NH_4OH$);
   (b) immersing said stainless device in said fluorine-containing solution to remove said extraneous matters from said stainless device; and
   (c) heating and maintaining said fluorine-containing solution at 40° C. to enhance the effect of removing said extraneous matters from said stainless device while not damaging said stainless device, while swirling said fluorine-containing solution sucb that said fluorine-containing solution flows around said stainless steel device to facilitate removal of said extraneous matters.

2. The method according to claim 1, where said stainless device is one selected from the group consisting of a stainless pipe, a stainless tank, a stainless cover, and a stainless vessel of a system used in said chemical vapor deposition process.

3. The method according to claim 1, wherein said extraneous matters is a silicon oxide.

4. The method according to claim 1, wherein said container is made of a material sufficient for resisting the corrosion of said fluorine-containing solution.

5. The method according to claim 1, wherein said fluorine-containing solution is made from dissolving ammonium acid fluoride ($NH_4F$) in a deionized water (DIW).

6. The method according to claim 1, wherein said fluorine-containing solution has a pH value ranged from about 6 to about 8.

7. The method according to claim 1, wherein said fluorine-containing solution is heated by a heater.

8. The method according to claim 1, wherein said fluorine-containing solution is heated by the reaction heat released from a neutralizing reaction for forming said fluorine-containing solution.

9. The method according to claim 1, wherein in said step (c), said fluorine-containing solution is swirled by using a pump.

10. The method according to claim 1, wherein said extraneous matters is formed during said chemical vapor deposition process and remained on a surface of said stainless device.

11. The method according to claim 10, wherein said chemical vapor deposition process is a borophosphosilicate glass (BPSG) depositing process using an atmospheric pressure chemical vapor deposition (APCVD).

12. The method according to claim 1, wherein in said step (c), said method further includes a step of generating bubbles from a bottom of said container so that said fluorine-containing solution can be enhanced to flow around said stainless steel to enhance said effect of removing said extraneous matters from said stainless device.

13. The method according to claim 12, wherein said bubbles are one selected from nitrogen bubbles ($N_2$) and clean-dry-air bubbles (CDA).

14. The method according to claim 1, wherein said stainless device is immersed in said fluorine-containing solution by a basket.

15. The method according to claim 14, wherein said basket is made of a material sufficient for resisting the corrosion of said fluorine-containing solution.

* * * * *